United States Patent [19]

Vinn

[11] Patent Number: 4,584,520
[45] Date of Patent: Apr. 22, 1986

[54] SWITCHABLE CURRENT SOURCE CIRCUITRY HAVING A CURRENT MIRROR AND A SWITCHING TRANSISTOR COUPLED IN PARALLEL

[75] Inventor: Charles L. Vinn, Milpitas, Calif.

[73] Assignee: Raytheon Company, Lexington, Mass.

[21] Appl. No.: 588,463

[22] Filed: Mar. 12, 1984

[51] Int. Cl.[4] .............................................. H03F 3/45
[52] U.S. Cl. .................................. 323/316; 323/317; 323/351; 330/257
[58] Field of Search ................ 307/270, 455; 323/315, 323/316, 317, 351; 330/257, 288

[56] References Cited

U.S. PATENT DOCUMENTS

| | | | |
|---|---|---|---|
| 4,267,519 | 5/1981 | Schade | 330/257 |
| 4,325,017 | 4/1982 | Schade | 323/313 |
| 4,361,816 | 11/1982 | Schade | 330/257 |

OTHER PUBLICATIONS

Motorola, "MC306G 3-Input Logic Gate", Product Release DS 9001-R1, Aug. '63.
Betts et al., "Emitter-Coupled Logic Circuit", IBM Technical Disclosure Bulletin, vol. 15, No. 7, Dec. 72, pp. 2178-2179.

Primary Examiner—Patrick Salce
Assistant Examiner—D. L. Rebsch
Attorney, Agent, or Firm—Richard M. Sharkansky; Denis G. Maloney

[57] ABSTRACT

A switchable current source circuit having a current mirror and a switch, such switch including a current source coupled to the current mirror, such switch enabling or disabling current from the current source to pass to the input of the current mirror selectively in accordance with a control signal fed to such switch. In one embodiment, the switch includes a differential amplifier and the current source is part of the differential amplifier. One of a plurality of control signals is fed to control the differential amplifier with the differential amplifier serving as both a logic circuit and current source, therefore, reducing the number of circuit comparators required to provide a switchable current source circuit.

10 Claims, 3 Drawing Figures

SWITCHABLE CURRENT SOURCE CIRCUITRY HAVING A CURRENT MIRROR AND A SWITCHING TRANSISTOR COUPLED IN PARALLEL

BACKGROUND OF THE INVENTION

This invention relates generally to switchable current source circuitry and more particularly to current source circuitry adapted to couple, or decouple, a current source to, or from, a load, selectively in accordance with the logical states of a plurality of logic signals.

As is known in the art, it is frequently desired to couple, or decouple, a current source to, or from, a load selectively in accordance with a predetermined combination of the logical states of a plurality of logic signals. This desired result may be accomplished by first feeding the logic signals to a logic gate, such as a NAND gate or NOR gate, to provide an output signal which is a function of the desired logical combination of the plurality of logic signals, and then subsequently using the gate's output signal as a control signal for an electronic switch disposed between the current source and the load. The switch, in response to the gate's output signal, would then couple or decouple the current source and the load selectively, in accordance with such output signal.

One such application for coupling, or decoupling a current source and a load selectively in accordance with a plurality of logic signals is in one type of switching voltage regulator. In such regulator, the regulated output voltage is fed back to one input of a comparator. The output of the comparator and the output of an oscillator are fed as inputs to a logic gate. The output of the oscillator periodically alternates between a logic 1 state and a logic 0 state. A second input to the comparator is fed to a reference potential such that the output of the comparator is a logic 1 state (when the magnitude of the voltage being regulated is lower than desired) and is a logic 0 state (when the magnitude of the voltage being regulated is at, or greater than, the desired voltage). When the voltage being regulated is less than the desired level, a control signal is produced to enable current from a current source to couple an output circuit which, in response to such current, increases the level of the output voltage. On the other hand, when the voltage being regulated finally rises to the desired output voltage, the control signal decouples the current source from the output circuit until such time as the level of the voltage being regulated falls below its desired, regulated level; in which case, the process repeats. Thus, it can be seen that the desired regulation may be achieved by feeding the outputs of the oscillator and the comparator to an AND (or NAND) gate; the output of such gate producing the above-mentioned control signal; such control signal being a periodic signal having a duty cycle which varies from 50% (as when the circuit is out of regulation or being "powered up") to approaching 0% (as when the circuit is in regulation).

Thus, while implementation of these circuits using separate components, i.e. separate oscillator, comparator and logic gate, is possible, the larger number of components to be so implemented generally increases the power dissipation of the regulator and also slows its response time.

SUMMARY OF THE INVENTION

In accordance with the present invention, a switchable current source circuit is provided including: a current mirror; and, switch means, including a current source coupled to the current mirror for enabling, or disabling, current from the current source to pass to the input of the current mirror selectively in accordance with a control signal fed to such switch.

In accordance with a first feature of the invention, the current mirror comprises: a transistor; and, a diode, such diode being coupled across the base-emitter junction of the transistor, the base of such transistor being coupled to the input of the current mirror. The switch means includes a second transistor having the emitter and collector thereof coupled between the base-emitter junction of the first-mentioned transistor with the base of the second transistor being fed by the control signal. In response to one level of the control signal, the second transistor is deactivated (i.e., placed in a non-conducting condition), and current from the current source is coupled to the input of the current mirror, such current mirror producing an output current through a load coupled to the collector of the first-mentioned transistor with a level proportional to the current produced by the current source; while in response to a second level of the control signal, the second-mentioned transistor is activated (i.e., placed in a conduction condition) and current from the current source passes through the activated second transistor, the first-mentioned transistor being placed in a non-conducting condition to prevent such current from the current source from passing to the input of the current mirror, such current mirror thereby being prevented from producing an output current through the load.

In accordance with an additional feature of the invention, the switch means is fed by a second control signal for directing, or diverting, such current source to, or from the input to the current mirror selectively in accordance with both the first and second control signals. With such an arrangement, the current produced by the current source is coupled to the input of the current mirror selectively in accordance with both the first and second control signals.

In a preferred embodiment of the invention, the switch means includes: a differential amplifier (or comparator) having a pair of transistors with first electrodes coupled in common to the current source of such amplifier; an output electrode of the first one of the pair of transistors is coupled to the input of the current mirror and also to a collector of a third transistor; and, an output electrode of a second one of the pair of transistors is coupled to a base of the third transistor. A diode is coupled across the base-emitter junction of the third transistor. The second control signal is fed to the base of the first one of the pair of transistors and a reference voltage is fed to the base of the second one of the pair of transistors. In response to a first level of the second control signal, current produced by the current source of the differential amplifier passes through one of the pairs of transistors to the output electrode thereof and to the input of the current mirror; said current mirror producing a proportional current through the load coupled to the output of the current mirror selectively in accordance with the level of the first control signal; while, on the other hand, in response to the second level of the second control signal, the other one of the pair of transistors passes the current produced by the current source thereby diverting current from the current source from the input of the current mirror and inhibiting current flow through the load regardless of the state of the first control signal.

With such arrangement described, because the current source is part of the differential amplifier and because one of the control signals is fed to control the differential amplifier, the differential amplifier serves as both a logic component and current source, thereby reducing the number of circuit components.

BRIEF DESCRIPTION OF THE DRAWINGS

For a more complete understanding of the concepts of this invention, reference is now made to the following description taken together in conjunction with the accompanying drawings in which.

DESCRIPTION OF THE PREFERRED EMBODIMENT

Figure 1:
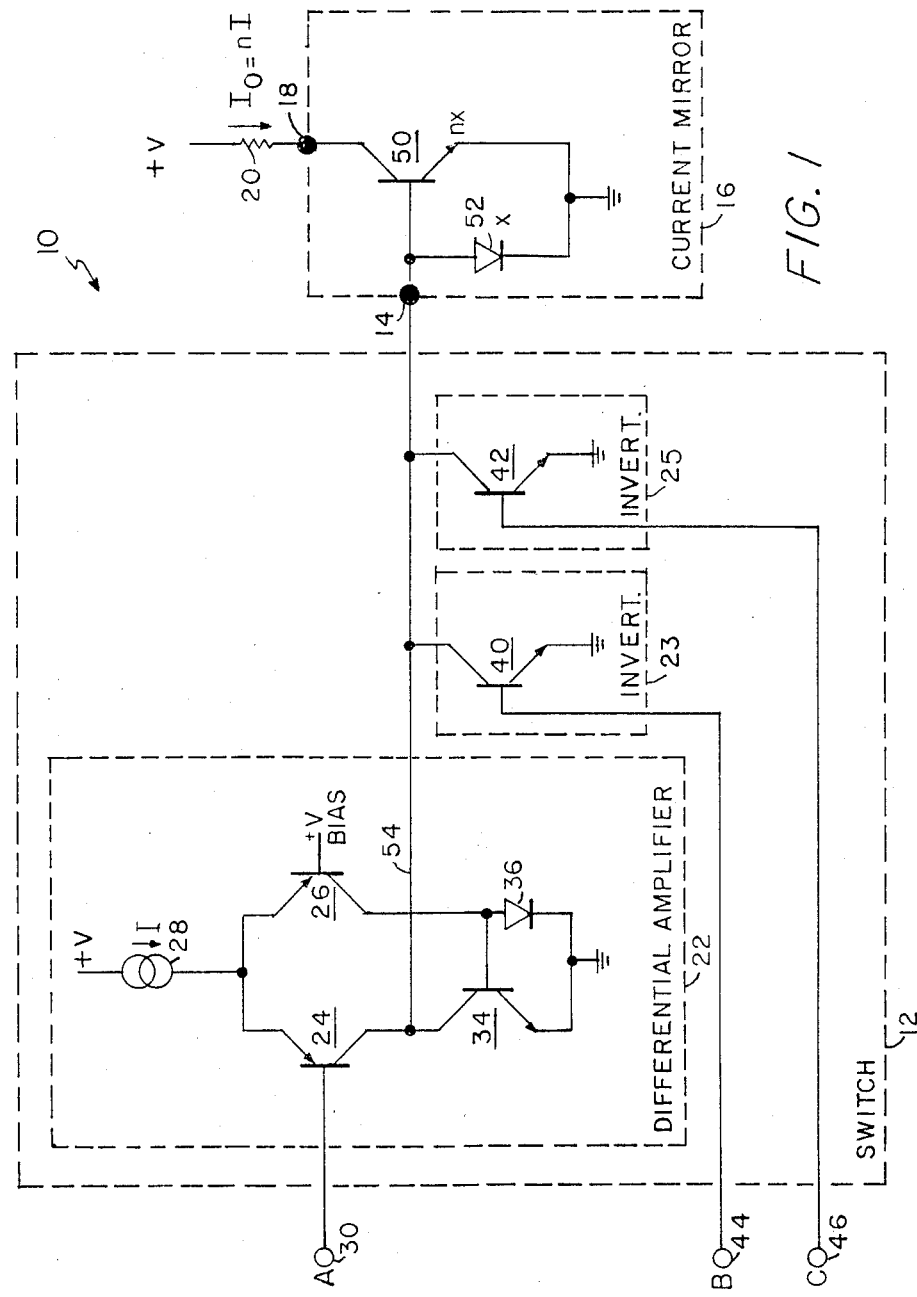
FIG. 1 is a schematic diagram of a switchable current source according to the invention.

Referring to FIG. 1, a switchable current source 10 is shown to include a switch 12 coupled to an input 14 of a current mirror 16, the output 18 of such current mirror 16 being coupled to a +V supply through a load 20, here a resistor, as shown. The switch 12 includes a differential amplifier 22, and a pair of inverters 23, 25, as shown. The differential amplifier 22 is of conventional design and includes a pair of transistors 24, 26 having first electrodes, here emitter electrodes, connected to the +V supply through a common current source 28, as shown. Here, current source 28 is of conventional design and produces a current I, as indicated. The control electrode, here the base electrode, of transistor 24 is coupled to a first logic signal, A, fed to input terminal 30, and the control electrode, here the base electrode, of transistor 26 is coupled to a bias, or reference voltage supply $+V_{BIAS}$. The collector electrodes of transistors 24, 26 are connected to the collector and base electrodes, respectively, of transistor 34. A diode 36 is connected between the grounded emitter of transistor 34 and the base of transistor 34. The collectors of transistors 24, 34 are connected to the input 14 of current mirror 16. The inverters 23, 25 include common (or grounded) emitter transistors 40, 42, respectively, having base, or control, electrodes fed by logic signals B and C, respectively. Signals B and C are coupled to additional input terminals 44, 46, respectively. Thus, transistors 40, 42 provide inverters 23, 25, respectively, coupled between input terminals 44, 46, respectively, and the input 14 of current mirror 16; the collector electrodes of the common emitter transistors 40, 42 being connected to the input 14 of the current mirror 16.

Completing the circuit 10, current mirror 16 is of conventional design and is shown to include a transistor 50 having: a grounded emitter; a collector connected to resistor load 20 at output terminal 18; and a base connected to the input 14 of the current mirror 16. A diode 52 has its anode connected to the base of transistor 50 and its cathode connected to the emitter of transistor 50, as shown. The diode 52 is a conventional P-N junction device; and may be a conventional diode-connected transistor. The transistor 50 is a N-P-N device. Thus, the P regions of the transistor 50 and diode 52 are connected together and the N regions of the diode 52 and transistor 50 are connected together. Further, the N-emitter region area of transistor 50 is n-times greater than the N-region area (X) of the diode 52. Thus, as is well known, if the current fed to the input terminal 14 has a level I, a current $I_O$ is produced through output terminal 18 of current mirror 16 having a level nI.

In operation, and considering first the operation of the differential amplifier 22, and assuming that both logic signals B and C are "low" (or logic 0 state) (i.e., transistors 40, 42 are nonconducting), current I from current source 28 will pass through the emitter-collector electrodes of transistor 24 when the logic signal A has a "low" level (i.e., less than the level of $V_{BIAS}$), a logic 0 state; no current will pass through transistor 26, hence diode 36 will not conduct and transistor 34 will be placed in a non-conducting state, thus, the current I from source 28 will then pass, via line 54, to the input 14 of current mirror 16, whereupon a current $I_O$ equal to nI will be produced through the load resistor 20. It is noted, however, that if either one of the logic signals B or C is "high" (logic 1 state), the one of the transistors 40, 42 coupled thereto will be placed in conduction, and the current on line 54 from source 28 will be directed to ground through the conducting one of the transistors 40, 42 with the result that no current will be fed to input 14 of mirror 16 and the output current $I_O$ will be zero. On the other hand, if the logic signal A has a "high" level (i.e., greater than the level $V_{BIAS}$), a logic 1 state, the current I produced by source 28 will pass through the emitter-collector electrodes of transistor 26 and through the diode 36 which will allow transistor 34 to become forward biased into conduction allowing the current I produced from source 28 to become diverted from line 54 and become directed to ground through now conducting diode 36 and, further, the conducting transistor 34 will produce a "low" voltage on line 54 turning transistor 50 "off", regardless of the logic states of the logic signals B and C. In summary, then, an output current $I_O$ equal to nI will be produced only if all of the logic signals A, B and C are "low" (or logic 0). Hence, the output current $I_O$ may be expressed as $I_O = nI\,(\overline{A}.\overline{B}.\overline{C})$. It is noted, therefore, that since the level of the current produced by current source 28 is well defined, and since the gain factor n is well defined by the current mirror 16, a well defined output current $I_O$ will be produced selectively when the proper logical combination of logic states of logic signals A, B and C (here $\overline{A}.\overline{B}.\overline{C}$) is fed to the circuit 10. Furthermore, the current source 28 is itself one of the elements of the differential amplifier 22; that is, the switch 12 has integrated within it the current source 28 used in its constituent differential amplifier 22. It is further noted that while two transistors 40, 42 have been included in switch 12, the number of such transistors may be increased or decreased.

Figure 2:
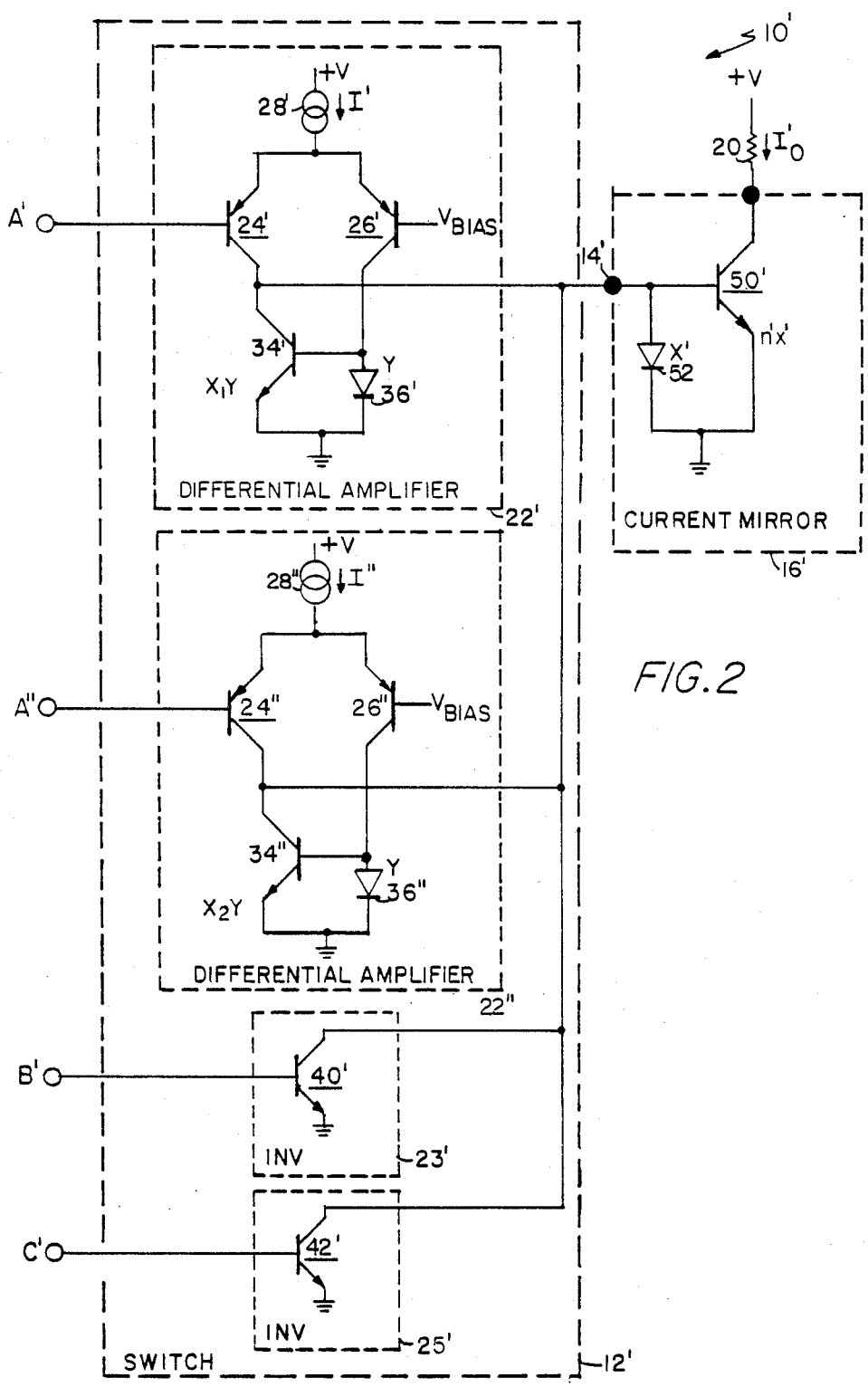
FIG. 2 is a schematic diagram of a switchable current source according to an alternative embodiment of the invention.

Referring now to FIG. 2, an alternative embodiment of a switchable current source, 10', is shown. Here, switchable current source 10' includes a switch 12' which includes a pair of differential amplifiers 22' 22" fed by logic signals A', A", respectively, and a pair of inverters 23', 25', here common emitter transistors 40', 42' coupled to logic signals B', C', respectively, as shown. Differential amplifiers 22', 22" are similar in construction to differential amplifier 22 (FIG. 1) except here a current source 28' of amplifier 22' produces a current I′, and a current source 28″ of amplifier 22″ produces a current I″ where I′ and I″ may be or may not be equal to each other. The collectors of transistors 24′, 24″, 40′ and 42′ are coupled to the input 14′ of current mirror 16′. Current mirror 16′ is similar in construction to current mirror 16 in FIG. 1, here having a transistor 50′ and diode 52′ connected as shown and configured to produce a gain factor n′. Here transistor 34′ and diode 36′ of differential amplifier 22′ are configured to provide a gain factor $X_1$, while transistor 34″ and diode 36″ of differential amplifier 22″ are configured to provide a gain factor of $X_2$. Further, $X_1 I'$ is greater than, or equal to, I″ and $X_2 I''$ is greater than, or equal to, I′.

In operation, as noted above in connection with FIG. 1, assuming that both logic signals B′ and C′ are "low" (i.e., transistors 40′, 42′ are non-conducting), and considering also that the logic signal A′ is "high" (a voltage greater than $V_{BIAS}$), when the logic signal A′ is "high" transistor 24′ is "off" and current I′ from source 28′ will pass through transistor 26′ and diode 36′ placing the input 14 of current mirror 16′ at a low voltage (0.3 volts) and also causing transistor 34′ to draw a current $X_1 I'$. Since logic signal A″ is "low", transistor 24″ is "on". Current I″ will pass from source 28″ through transistor 24′ to ground through conducting transistor 34′. Since current I″ is less than the current $X_1 I'$ which transistor 34′ tries to draw, it is ensured that current will not flow from source 28″ to input terminal 14. Similarly, if the A′ logic signal is "low" and the logic signal A″ is "high", transistor 24′ is "on" and transistor 24″ is "off". Since the current $X_2 I''$ which transistor 34″ now draws is more than current I′ which source 28′ supplies to it, this ensures that current I′ from source 28′ will not flow into input terminal 14 of current mirror 16′. On the other hand, if both logic signals A′ and A″ are "high", it follows that current from source 28′ will pass to ground through transistor 34″ and current from source 28″ will pass to ground through transistor 34′ and a low voltage level of terminal 14 will disable the current mirror 16′. Thus, only when all of the logic signals A′, A″, B′ and C′ are "low" (logic 0) will transistors 24′, 24″ conduct and allow a composite current of level (I′+I″) pass to input 14′ of current mirror 16′ with the result that an output circuit $I_O' = n(I'+I'')$ pass to load 20.

Figure 3:
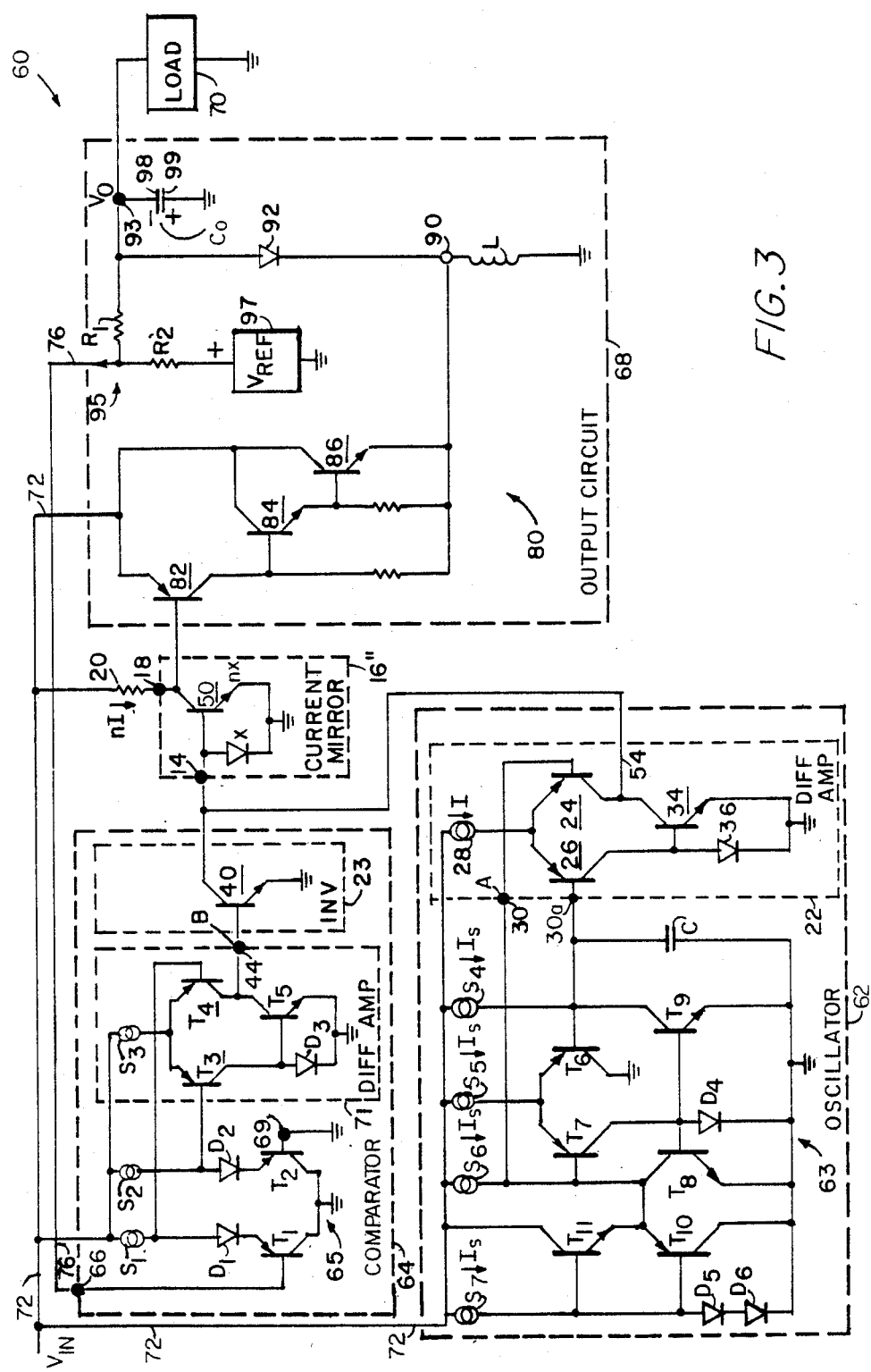
FIG. 3 is a schematic diagram of a voltage regulator according to the invention.

Referring now to FIG. 3, a voltage regulator 60 is shown to include an oscillator 62 and a comparator 64 having outputs thereof fed to the input 14 of current mirror 16″, as shown. The output of current mirror 16″ is fed to an output circuit 68, as shown. As will be described in detail hereinafter, regulator 60 produces an output voltage $V_O$ at the output 93 of output circuit 68 for a load 70 coupled to such regulator 60, such output voltage $V_O$ having a preselected value $V_{REG}$. An input voltage $V_{IN}$ is fed to the comparator 64, oscillator 62, current mirror 16″ and output circuit 68, via power bus 72, as shown. Briefly, a signal having a voltage level related to the level of the output voltage $V_O$ is produced by the output circuit 68 on line 76 and such produced signal is fed back as an input to comparator 64, as shown. Comparator 64 is of conventional design having: a conventional level shifting input stage 65 with one input 66 coupled to line 76 and a second input 69 referenced to ground potential, as shown; an intermediate differential amplifier section 71 fed by the level shifting section 65; and, an output stage, here an inverter 23, equivalent to the inverter 23 shown and described in connection with FIG. 1, such inverter 23 including the common, or grounded emitter transistor 40 with its collector connected to input 14 of current mirror 16″, as shown. Thus, it is noted that terminal 44 of such inverter 23 is indicated as being fed by a signal B as described in connection with FIG. 1. Comparator 64 will place transistor 40 in a conducting condition when the magnitude of output voltage $V_O$ is greater than, or equal to, the magnitude of desired voltage $V_{REG}$, while, on the other hand, comparator 64 will place transistor 40 in a non-conducting condition when the magnitude of the output voltage $V_O$ is less than the magnitude of the desired voltage $V_{REG}$.

While the details of oscillator 62 will be described hereinafter, it should be noted that such oscillator 62 is of conventional design having an input stage 63 feeding the output stage thereof, here a differential amplifier 22, equivalent to the differential amplifier 22 shown, and described above in connection with FIG. 1. A control signal A is fed to terminal 30, as in FIG. 1, the input stage 63 produces the equivalent of the bias voltage $V_{BIAS}$ (FIG. 1); here, however, the bias voltage at terminal 30a varies periodically with time in a manner to be described. In any event, current I produced by current source 28, will pass through transistor 24 during those periods of time when the level of the signal A at terminal 30 is less than the level of the signal at terminal 30a and current I from source 28 will pass through transistor 26 during those periods of time when the level of the signal A is greater than the level of the signal at terminal 30a. Thus transistors 24 and 26 will periodically alternate between conducting and non-conducting states at correspondingly mutually exclusive interleaving time intervals and oscillator 62 will produce a train of current pulses on line 54 having a 50% duty cycle; the current pulses being produced when transistor 24 conducts and the intervals between successive pulses occurring during the time periods transistor 26 conducts. The train of current pulses is fed to the input 14 of current mirror 16″, each pulse of current in the train thereof being produced by the current source 28 included within the differential amplifier 22 of such oscillator 62.

It is noted that differential amplifier 22 of oscillator 62 and inverter 23 of comparator 64 comprise a switch equivalent to switch 12 described above in connection with FIG. 1. Further, comparator 64 will place transistor 40 of the inverter 23 in a conducting condition when the magnitude of the output voltage $V_O$ is greater than, or equal to, the magnitude of the desired voltage $V_{REG}$, while, on the other hand, comparator 64 will place transistor 40 in a non-conducting condition when the level of the output voltage $V_O$ is less than the magnitude of the desired voltage $V_{REG}$. Thus, when the regulator 60 is being "powered up", that is, when output voltage $V_O$ is being "brought up" negatively from ground potential to its desired level of $V_{REG}$, the comparator 64 places transistor 40 in a non-conducting state, and a train of current pulses having a 50% duty cycle is fed to the input terminal 14 of the current mirror 16″. Such current mirror 16″ thereby produces current pulses having levels nI (because of the gain factor "n" of the current mirror 16″) through the load resistor 20 coupled to the output terminal 18 thereof thereby periodically activating current output circuit 68, in a manner to be described in detail hereinafter. Suffice it to say here, however, that when output circuit 68 is activated, the magnitude of output voltage $V_O$ increases, negatively, until it reaches the magnitude of the desired voltage $V_{REG}$ at which time comparator 64 places transistor 40 in a conduction condition, disabling current mirror 16" by producing a "low" voltage at its input 14 and thereby deactivating output circuit 68. As the output voltage now "falls" in magnitude below the desired magnitude such reduced magnitude is detected by comparator 64 thereby placing transistor 40 in a non-conducting state to thereby again activate both current mirror 16" and the output stage 68.

More particularly, output stage 68 includes an input switching section 80 fed by a control voltage produced by resistor 20 at the output terminal 18 of current mirror 16" in response to a current pulse of level nI passing through such resistor 20. When the current pulse of level nI is produced by current mirror 16", the resulting voltage developed across resistor 20 turns transistors 82, 84, and 86 "on", electrically coupling the input voltage $V_{IN}$ (minus the $V_{CE}$ voltage drop of transistors 84 and 86 on bus 72) to intermediate terminal 90; whereas, when no current is produced by current mirror 16", transistors 82, 84, and 86 turn "off" thereby electrically decoupling the input voltage $V_{IN}$ from the intermediate terminal 90. Output circuit 68 includes an inductor L coupled between ground and intermediate terminal 90. A diode 92 is coupled between intermediate terminal 90 and the output terminal 93 of the regulator 90, as shown, such diode 92 being coupled with its anode connected to the output terminal 93 and its cathode connected to the intermediate terminal 90, as shown. An output capacitor $C_0$ is connected between the output terminal 93 of the regulator 60 and ground potential, as shown. A voltage divider network 95 comprising serially connected resistors $R_1$, $R_2$ is connected between the output terminal 93 and ground potential through a serially coupled conventional voltage reference source 97, as shown. The voltage reference source 97 produces a fixed reference voltage $V_{REF}$, as indicated. The output of the voltage divider network 95, that is the output between the two serially connected resistors $R_1$, $R_2$ is connected to line 76, as shown. As noted above, as the regulator 60 is being "powered up", transistor 40 of comparator 64 is "off" and a train of current pulses will be produced through load 20. Further, energy stored in an inductor L will be electrically coupled to the capacitor $C_O$ (and to load 70) at a 50% duty cycle rate to charge such capacitor $C_O$. More particularly, in operation, as the regulator 60 is being "powered up", a train of voltage pulses with a 50% duty cycle is produced at intermediate terminal 90, as described above. When a voltage pulse of level $V_{IN}$ is produced at intermediate terminal 90, diode 92 is back-biased and current starts to pass through inductor L. When the voltage pulse is removed, since the current through the inductor L cannot change instantaneously, a voltage of $V_O - V_{BE}$ (where $V_{BE}$ is the drop across diode 92) is produced by the inductor L at the intermediate terminal 90, thereby forward biasing diode 92 to conduction causing output capacitor $C_O$ to charge and produce a voltage of increasing magnitude across the electrodes 98, 99 thereof; it being noted that the electrode 98 connected to output terminal 93 will be negative in potential relative to grounded electrode 99. A train of current pulses is thus produced by the inductor L, diode 92 periodically conducts, and during the periods of time such diode 92 is in a conducting state, a current is coupled through the diode 92 to the output terminal 93 with the result that the output capacitor $C_O$ charges to the desired voltage level-$V_{REG}$. As noted, the polarity of the voltage developed across the output capacitor $C_O$ is such that a negative voltage will be produced at the output terminal 93 of the regulator 60. Resistors $R_1$, $R_2$ and the reference voltage $V_{REF}$ are selected so that $R_2 (V_{REF}/R_1) = -V_{REG}$. Thus, when the output voltage $V_O$ produced across capacitor $C_O$ reaches the level $V_{REG}$, the voltage on line 76 goes to ground potential and if the output voltage $V_O$ tends to go more negative than the desired output voltage $V_{REG}$, comparator 64 places the transistor 40 into a conduction state disabling current mirror 16" and thereby preventing any further train of current pulses from being produced at intermediate terminal 90. As the output voltage $V_O$ produced across capacitor $C_O$ decreases, as when the charge on such capacitor $C_O$ leaks to the load 70, the voltage on line 76 falls below ground potential and comparator 64 places transistor 40 in a non-conducting condition thereby enabling current mirror 16" to cause the train of current pulses, produced by oscillator 62, to produce a train of mirrored current pulses of level nI through load resistor 20 periodically enabling switch 80 to couple energy to intermediate terminal 90. As noted above, this periodically places the diode 92 in conduction, non-conduction state allowing the energy stored in inductor L to pass through the diode 92 during its conduction states and again build up the charge on the output capacitor $C_O$ with the result that the output voltage $V_O$ becomes again regulated.

Referring now, in more detail, to comparator 64, it is noted that when the voltage on line 76, that is at input terminal 66, is more positive than ground potential, the regulator 60 is being "powered up", or if $V_{REG}$ is lower than its desired value. Transistors $T_1$, $T_2$, diodes $D_1$, $D_2$ and current sources $S_1$, $S_2$ are arranged, as shown, to provide conventional level shifting of the applied voltages. In response to such level shifted voltages, current from source $S_3$ of differential amplifier 71 passes through transistor $T_3$ placing diode $D_3$ in a conducting condition to forward bias transistor $T_5$ producing a relatively low voltage at the input 44 of inverter 23; that is, the level of signal B is "low". On the other hand, when the regulator 60 produces an output voltage $V_{OUT}$ greater than or equal to $V_{REG}$, the voltage at terminal 66 of comparator 64 goes below ground potential with the result that transistor $T_3$ is placed in a non-conducting condition placing diode $D_3$ and transistor $T_5$ in non-conducting states while transistor $T_4$, being in a conducting condition, couples the relatively "high" voltage $V_{IN}$ to the input terminal 44 of inverter 23, causing the signal B to be in a "high" condition. In summary then, the signal B is in a "low" condition as the regulator 60 is being "powered up" and once such regulator 60 produces the desired output voltage, the signal B goes to a "high" level.

Consider now the details of oscillator 62, the operation of such oscillator will begin by first discussing the portion of the operating phase when capacitor C thereof is being charged positively towards $V_{IN}$ by current $I_s$ from source $S_4$. During this charging phase, transistor $T_6$ is conducting current $I_s$ from source $S_5$ while transistor $T_7$ is not conducting. Thus transistor $T_8$ and diode $D_4$ are in non-conducting states. Further, transistor $T_9$ is in a non-conducting condition. Thus, current $I_s$ from source $S_6$ passes through conducting transistor $T_{10}$. Current $I_s$ from source $S_7$ passes through conducting diodes $D_5$, $D_6$. Thus, it is noted that during this capacitor charging phase, a voltage of 2.1 volts (i.e., the 0.7 volts drop across each diode $D_5$, $D_6$ and the 0.7 volt $V_{BE}$ drop across transistor $T_{10}$) is produced at the base of transistor $T_7$. It is also noted that transistor $T_{11}$ is placed in a non-conducting condition during this capacitor charging phase. Thus, in summary, the current $I_s$ from source $S_7$ passes through diodes $D_5$, $D_6$; the current $I_s$ from source $S_6$ passes through conducting transistor $T_{10}$; the current $I_s$ from source $S_5$ passes through transistor $T_6$; the current $I_s$ from source $S_4$ passes through capacitor C, as it charges; zero current passes through transistor $T_9$ and also zero current passes through transistor $T_8$; and, a 2.1 volt potential is produced at the base of transistor $T_7$.

When the capacitor C charges to (slightly greater than) 2.1 volts, transistor $T_6$ goes "off" and transistor $T_7$ goes "on". Thus, current $I_s$ from source $S_5$ passes through the collector of transistor $T_7$. Transistor $T_9$ and diode $D_4$ act as a current mirror, here with a gain factor of 2; thus the collector of transistor $T_9$ "pulls" a current $2I_s$. Since source $S_4$ produces a current $I_s$, the additional current $I_s$ is supplied by the capacitor C and thus capacitor C discharges through the conducting transistor $T_9$. Further, transistor $T_8$ and diode $D_4$ also provide a current mirror, here with a gain factor of 2, with the result that the collector of transistor $T_8$ "pulls" a current $2I_s$. The difference between the current $2I_s$ through transistor $T_8$ and the current $I_s$ from source $S_6$ flows through now conducting transistor $T_{11}$ causing a 0.7 volt reference to be produced at the base of transistor $T_7$. Transistor $T_{10}$ is now biased "off". The capacitor C thus discharges from 2.1 volts until it reaches the 0.7 volt reference at the base of transistor $T_7$ at which time transistor $T_7$ goes "off" and transistor $T_6$ goes "on" and the charging/discharging process repetitively repeats. Thus, it is seen that capacitor C produces a series of triangular voltage waveforms which peak at 2.1 volts and which fall to 0.7 volts. This voltage waveform is fed to the base of transistor 26 at terminal 30a. Further, as noted above, the voltage at the base of transistor $T_7$ switches from 0.7 volts as when it conducts, (i.e., when capacitor C is discharging to 2.1 volts). Thus, when capacitor C charges, the voltage on line 30a is less positive than the 2.1 volts on terminal 30 and transistor 26 conducts, turning "on" transistor 34 and diode 36 and no current pulse is produced on line 54; however, when capacitor C discharges, the 0.7 volts on the base of transistor 24 is less positive than the voltage at the base of transistor 26 and thus transistor 26 is placed in a non-conducting condition and the current I from source 28 passes through conducting transistor 24 to the input 14 of current mirror 16" via line 54. In response to the current I on line 54, current mirror 16" produces a current nI through resistor 20, as discussed; it again being noted that the current source 28 is part of the differential amplifier 22, and therefore, in addition to differential amplifier 22 functioning as part of a switch, it also serves as a source of current which current mirror 16" mirrors.

Having described a preferred embodiment of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What I claim is:

1. A switchable current source circuit comprising:
   a current mirror; and,
   switch means, including a current source, coupled to the current mirror for enabling, or disabling, current from the current source to pass to an input of the current mirror selectively in accordance with a control signal fed to such switch means, such switch means including a transistor having the emitter and collector thereof coupled in parallel with the current mirror, the base of the transistor being fed by the control signal, and wherein in response to one level of the control signal, such switch means places the transistor in a non-conducting condition between the collector and emitter to enable the current from the current source to pass to the input of the current mirror, such current mirror producing an output current through a load coupled thereto with a level proportional to the current produced by the current source, while in response to a second level of the control signal, such switch means places the transistor in a conducting condition between the emitter and collector and current from the current source passes through the emitter and collector of the transistor to prevent such current from the current source from passing to the input of the current mirror, such current mirror thereby being prevented from producing the output current through the load.

2. The switchable current source circuit recited in claim 1 wherein the current mirror comprises:
   a second transistor; and,
   a diode, such diode being coupled across the base-emitter junction of the second transistor, the base of such second transistor being coupled to the input of the current mirror.

3. The switchable current source circuit recited in claim 2 wherein:
   the first-mentioned transistor has the emitter and collector thereof coupled between the base-emitter junction of the second transistor with the base of the first-mentioned transistor being fed by the control signal, and wherein in response to one level of the control signal, the first-mentioned transistor is deactivated to enable the current from the current source to pass to the input of the current mirror, such current mirror producing the output current through the load coupled to the collector of the second transistor with a level proportional to the current produced by the current source, while in response to a second level of the control signal, the first-mentioned transistor is activated and current from the current source passes through the activated first-mentioned transistor, the second transistor being placed in a non-conducting condition to prevent such current from the current source from passing to the input of the current mirror, such current mirror thereby being prevented from producing the output current through the load.

4. The switchable current source circuit recited in claim 3 wherein:
   the switch means is fed by a second control signal for directing, or diverting, such current source to, or from the input to the current mirror selectively in accordance with both the first-mentioned control signal and second control signal.

5. The switchable current source circuit recited in claim 4 wherein the switch means includes:
   a pair of transistors with first electrodes coupled in common to the current source;
   an output electrode of the first one of the pair of transistors being coupled to the input of the current mirror and also to a collector of a third transistor; and, an output electrode of a second one of the pair of transistors is coupled to a base of the third transistor.

6. The switchable current source circuit recited in claim 5 including:

a diode coupled across the base-emitter junction of the third transistor.

7. The switchable current source circuit recited in claim 6 wherein:

the second control signal is fed to the base of the first one of the pair of transistors and a reference voltage is fed to the base of the second one of the pair of transistors, and wherein in response to a first level of the second control signal, current produced by the current source passes through one of the pairs of transistors to the output electrode thereof and to the input of the current mirror, said current mirror producing a proportional current through the load coupled to the output of the current mirror selectively in accordance with the level of the first control signal, while, on the other hand, in response to the second level of the second control signal, the other one of the pair of transistors passes the current produced by the current source thereby diverting current from the current source from the input of the current mirror and inhibiting current flow through the load regardless of the state of the first control signal.

8. A switchable current source circuit, comprising:
(a) a circuit means having:
  (i) a first transistor; and
  (ii) a diode coupled between a base and emitter of the first transistor;
(b) a second transistor having: a collector coupled to the base of the first transistor; an emitter coupled to the emitter of the first transistor; and a base adapted for coupling to a first logic signal source;
(c) a differential amplifier comprising:
  (i) a current source;
  (ii) a third transistor;
  (iii) a second diode coupled between a base and emitter of the third transistor, the emitter of the third transistor being coupled to the emitter of the first and second transistors; and,
  (iv) a pair of transistors, an emitter of each one thereof being coupled in common to the current source; a first one of such pair of transistors having: a base adapted for coupling to a second control signal; and, a collector electrode coupled to: the base of the first transistor; the collector of the second transistor; and, a collector of the third transistor; and wherein the second one of the pair of transistors has a collector coupled to the base of the third transistor.

9. The circuit recited in claim 8 including a reference voltage source coupled to the base of the second one of the pair of transistors.

10. The circuit recited in claim 9 including a load coupled between a first potential of a second voltage source and the collector of the first transistor, the emitter of the first, second and third transistors being at a second potential of the second voltage source.

* * * * *